(12) United States Patent
Biloiu et al.

(10) Patent No.: US 9,620,335 B2
(45) Date of Patent: Apr. 11, 2017

(54) IN SITU CONTROL OF ION ANGULAR DISTRIBUTION IN A PROCESSING APPARATUS

(71) Applicant: Varian Semiconductor Equipment Associates, Inc., Gloucester, MA (US)

(72) Inventors: Costel Biloiu, Rockport, MA (US); Nini Munoz, Ithaca, NY (US); Ludovic Godet, Sunnyvale, CA (US); Anthony Renau, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/065,141

(22) Filed: Mar. 9, 2016

(65) Prior Publication Data

US 2016/0189935 A1 Jun. 30, 2016

Related U.S. Application Data

(63) Continuation of application No. 14/139,679, filed on Dec. 23, 2013, now Pat. No. 9,293,301.

(51) Int. Cl.
*H01J 37/32* (2006.01)

(52) U.S. Cl.
CPC .. *H01J 37/32532* (2013.01); *H01J 37/32357* (2013.01); *H01J 37/32412* (2013.01); *H01J 37/32422* (2013.01); *H01J 37/32568* (2013.01); *H01J 2237/3365* (2013.01)

(58) Field of Classification Search
CPC combination set(s) only.
See application file for complete search history.

(56) References Cited

U.S. PATENT DOCUMENTS

| | | | | |
|---|---|---|---|---|
| 2007/0224709 A1* | 9/2007 | Ogasawara | ....... | H01J 37/32642 438/5 |
| 2008/0132046 A1* | 6/2008 | Walther | ................... | H01J 37/08 438/513 |
| 2008/0179546 A1* | 7/2008 | Lee | ....................... | H01J 27/024 250/492.21 |
| 2010/0255665 A1* | 10/2010 | Godet | ............... | H01J 37/32623 438/513 |

FOREIGN PATENT DOCUMENTS

CN 101167155 A 4/2008

\* cited by examiner

*Primary Examiner* — Phillip A Johnston
*Assistant Examiner* — Hsien Tsai

(57) ABSTRACT

A processing apparatus may include a plasma source coupled to a plasma chamber to generate a plasma in the plasma chamber, an extraction plate having an aperture disposed along a side of the plasma chamber; a deflection electrode disposed proximate the aperture and configured to define a pair of plasma menisci when the plasma is present in the plasma chamber; and a deflection electrode power supply to apply a bias voltage to the deflection electrode with respect to the plasma, wherein a first bias voltage applied to the deflection electrode is configured to generate a first angle of incidence for ions extracted through the aperture from the plasma, and a second bias voltage applied to the deflection electrode is configured to generate a second angle of incidence of ions extracted through the aperture from the plasma, the second angle of incidence being different from the first angle of incidence.

14 Claims, 10 Drawing Sheets

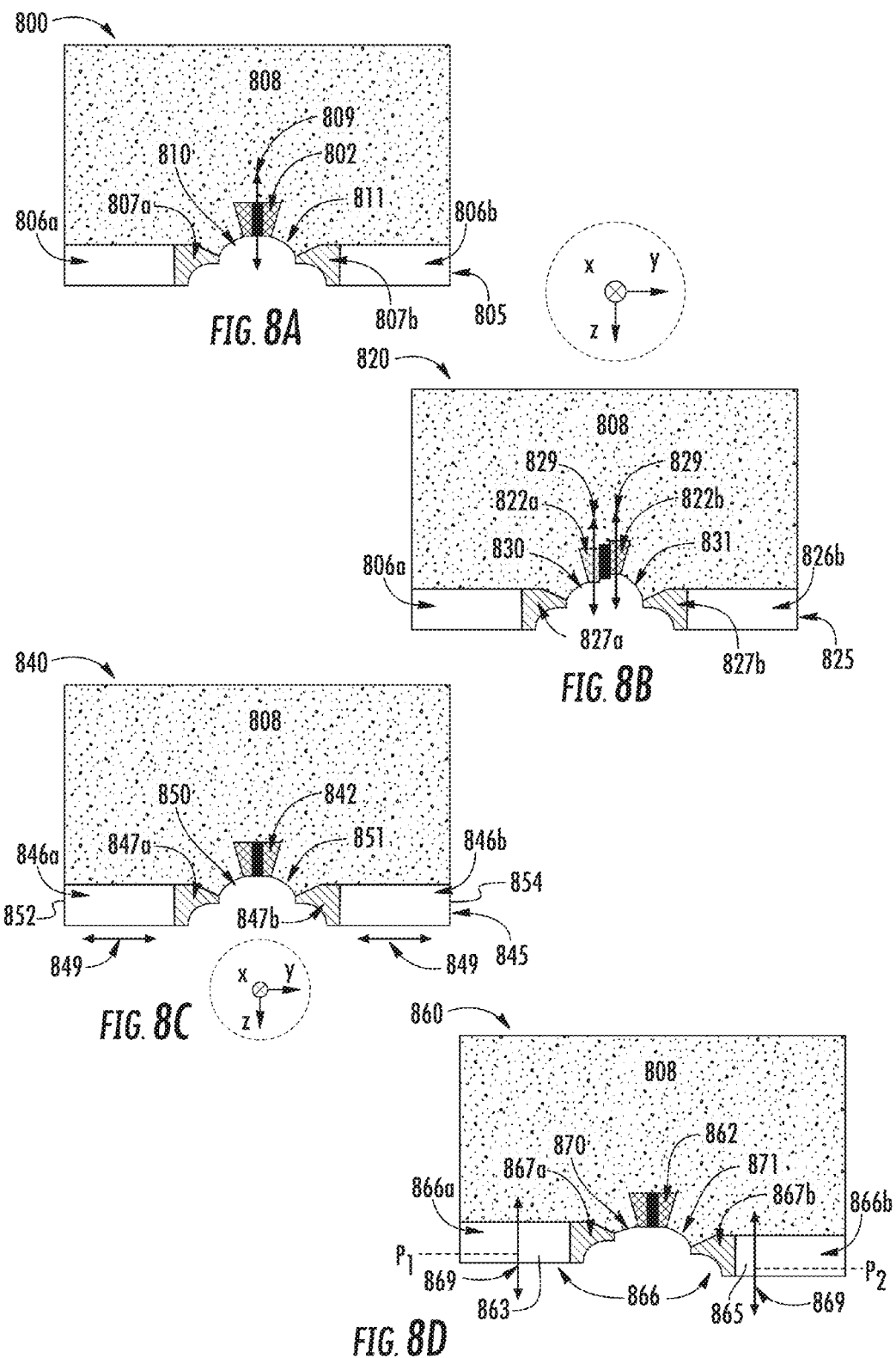

IN SITU CONTROL OF ION ANGULAR DISTRIBUTION IN A PROCESSING APPARATUS

CROSS-REFERENCE TO RELATED APPLICATIONS

This is a continuation of pending U.S. patent application Ser. No. 14/139,679, filed Dec. 23, 2013, entitled "In Situ Control Of Ion Angular Distribution In A Processing Apparatus" the entirety of which application is incorporated by reference herein.

FIELD OF THE DISCLOSURE

The present embodiments relate to a processing apparatus, and more particularly, to control of the angular distribution of the ions extracted from a plasma.

BACKGROUND

Conventional apparatus used to treat substrates with ions include beamline ion implanters and plasma immersion ion implantation tools. Both are appropriate for implanting ions over a range of energies. In beamline ion implanters ions are extracted from a source, mass analyzed and then transported to the substrate surface. In plasma immersion ion implantation apparatus, a substrate is located in the same chamber the plasma is generated adjacent to the plasma. The substrate is set at negative potential with respect to the plasma and ions that cross the plasma sheath in front of the substrate impinge on the substrate at perpendicular incidence angle. Recently a new processing apparatus that allows control of extracted ion angular distribution (IAD) has been developed. In this apparatus, ions are extracted from a plasma chamber but unlike the beamline where the substrate is located remotely from the ion source, the substrate is located proximate the plasma chamber. Ions are extracted through an aperture of special geometry located in an extraction plate that is placed proximate a plasma. Changing the geometry of the aperture allows changing of the ion angular distribution, i.e., the mean angle and angular spread of the ion distribution. This may be appropriate to treat substrates that present surface features whose sidewalls are to be exposed to ions, for the purposes of implantation, etching, or other processing. In order to treat such sidewalls, ions are extracted through the aperture of a shape and size to generate a desired ion angular distribution. However, it may be desirable to provide further control in a plasma system over ion angular distribution in order to process substrates more effectively. It is with respect to these and other considerations that the present improvements have been needed.

SUMMARY

In one embodiment, a processing apparatus includes a plasma source coupled to a plasma chamber to generate a plasma in the plasma chamber. The system may also include an extraction plate disposed along a side of the plasma chamber, the extraction plate having an aperture, a deflection electrode disposed proximate the aperture and configured to define a pair of plasma menisci when the plasma is present in the plasma chamber, and a deflection electrode power supply to apply a bias voltage to the deflection electrode with respect to the plasma. When a first bias voltage is applied by the deflection electrode power supply a first angle of incidence for ions extracted through the aperture from the plasma may be generated, and when a second bias voltage applied to the deflection electrode power supply a second angle of incidence of ions extracted through the aperture from the plasma may be generated, where the second angle of incidence is different from the first angle of incidence.

In a further embodiment, a method of controlling ion angular distribution in an ion beam provided to a substrate includes generating a plasma in a plasma chamber adjacent a process chamber that contains the substrate; providing an extraction plate having an aperture between the plasma chamber and process chamber; arranging a deflection electrode proximate the aperture; and varying a deflection electrode voltage applied to the deflection electrode from a first voltage to a second voltage, wherein the first voltage is configured to generate a first angle of incidence for ions extracted from the plasma, and second voltage is configured to generate a second angle of incidence of ions extracted through the aperture from the plasma, the second angle of incidence being different from the first angle of incidence.

BRIEF DESCRIPTION OF THE DRAWINGS

FIGS. 8A-8D present illustration of operation of various extraction components in processing apparatus according to different embodiments;

DETAILED DESCRIPTION

The embodiments described herein provide apparatus and methods for controlling angular distribution of ions directed to a substrate. In particular, the present embodiments provide a novel extraction system to generate ion beams from a plasma and control their ion angular distribution (IAD). The term "ion angular distribution" refers to the mean angle of incidence of ions in an ion beam with respect to a reference direction such a perpendicular to a substrate, as well as to the width of distribution or range of angles of incidence centered around the mean angle, termed "angular spread" for short. In the embodiments disclosed herein the novel extraction system may include an extraction plate located adjacent a plasma and containing at least one aperture to extract ions from the plasma and accelerate ions toward a substrate based on electrical potential difference between the plasma and the substrate. The extraction system may also include a deflection electrode that is located proximate the aperture of the extraction plate and that serves to generate two ion beams. As detailed below, the angle of incidence of ion beams is controlled by adjusting voltages applied to the extraction system or adjusting positioning of the various components of the extraction system, or both.

Figure 1A:
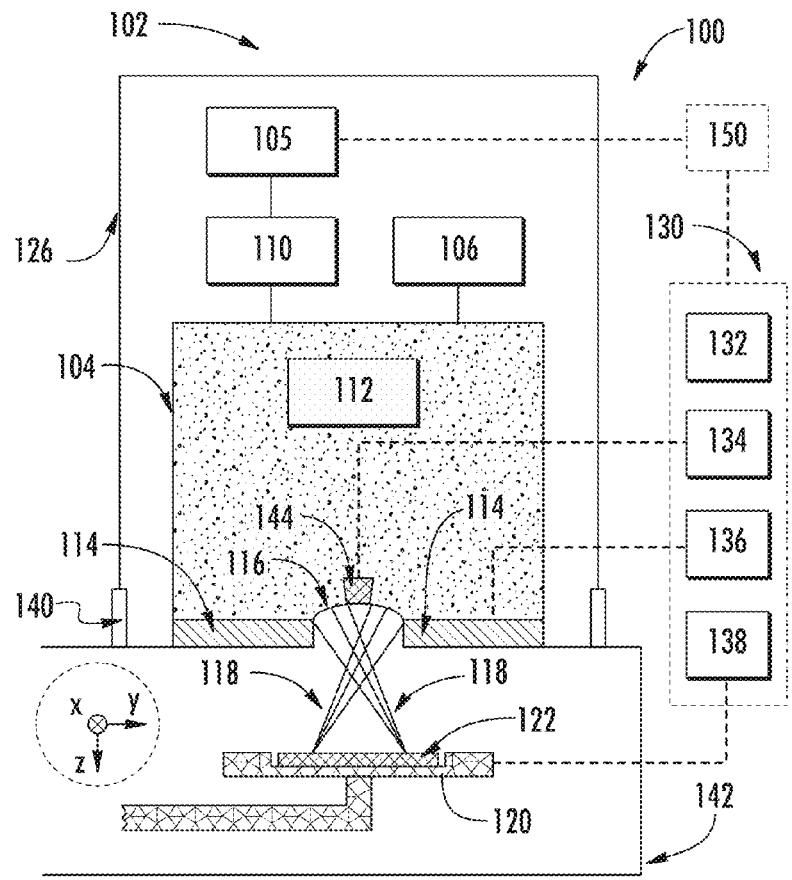
FIG. 1A depicts a side view of a processing apparatus consistent with embodiments of this disclosure.

FIG. 1A depicts a processing apparatus 100 consistent with embodiments of this disclosure. Processing apparatus 100 includes a plasma source 102 to generate a plasma 112 in a plasma chamber 104. Plasma source 102 may be an RF plasma source (inductively-coupled plasma (ICP) source, capacitively coupled plasma (CCP) source, helicon source, electron cyclotron resonance (ECR) source), indirectly heated cathode (IHC) source, glow discharge source, or other plasma sources known to those skilled in the art. In this particular embodiment, the plasma source 102 is an ICP source with an RF generator 105, an RF matching network 110. The transfer of the RF power from the RF generator to the gas atoms and/or molecules takes places through an antenna and a dielectric window (not shown). A gas manifold 106 is connected to the plasma source 102 through appropriate gas lines and gas inlets. The plasma source 102 or other components of the processing apparatus 100 also may be connected to a vacuum system (not shown), such as a turbo molecular pump backed by a rotary or membrane pump. The plasma source 102 is surrounded by an enclosure 126, and an insulator 140 separates the enclosure 126 from a process chamber 142 that includes a substrate holder 120. Plasma source 102 and substrate holder 120 may be at elevated electrical potential or may be electrically grounded whereas the process chamber 142 may be electrically grounded.

An extraction plate 114 may be arranged along a side of plasma chamber 104, as shown in FIG. 1A. In the view of FIG. 1A, the extraction plate 114 is arranged at the bottom of the plasma chamber 104. The extraction plate 114 in particular is disposed between the plasma chamber 104 and process chamber 142. The extraction plate 114 may define a portion of a chamber wall of the plasma chamber or process chamber or both, in some instances. The extraction plate 114 includes an aperture 116 through which ions 118 may be extracted as ion beams and directed toward the substrate holder 120.

The processing apparatus 100 further includes a plurality of voltage supplies used to drive the extraction optics and to control ion beam energy provided to the substrate 122. These are illustrated collectively as an extraction voltage system 130. In various embodiments, the extraction voltage system 130 may include a chamber power supply 132, deflection electrode power supply 134, extraction plate power supply 136, and a substrate power supply 138. In order to generate positive ion beams as represented by ions 118 having a desired energy at the substrate 122, the substrate power supply 138 may bias the substrate holder 120 negatively with respect to ground, while the plasma chamber 104 is grounded. Alternatively, the plasma chamber 104 may be biased positively with respect to ground and the substrate holder 120 may be grounded or biased negatively with respect to ground. In some embodiments, the extraction plate 114 may be biased independently of the plasma chamber 104 using the extraction plate power supply 136 or may be floating. Similarly, the deflection electrode power supply 134 may be biased with respect to the chamber power supply 132. The embodiments are not limited in this context.

Processing apparatus 100 also includes a control system 150 to control plasma density (by controlling the RF power and the gas pressure inside the plasma chamber) as well as ion energy and ion angular distribution (IAD) as detailed below. The control system 150 may include a combination of hardware and software components that direct operation of the RF generator 105, mass flow controllers (not shown), and extraction voltage system 130.

In various embodiments, the substrate holder 120 may be coupled to a drive (not shown) that is configured to move the substrate holder 120 along a direction parallel to the Y axis of the Cartesian coordinate system shown. In further embodiments, the substrate holder 120 may be movable along a direction parallel to the X-axis, Z-axis, or both. This provides the processing apparatus 100 with two decrees of freedom, i.e., allows relative position of the substrate vs extraction aperture to be modified and allows the substrate 122 to be scanned with respect to the aperture 116 so that ions 118 may be provided over the entire surface of substrate 122 in some instances.

In various additional embodiments, and as detailed below, the extraction plate 114 may include separate portions that define the aperture 116. The separate portions (not shown in FIG. 1A) may be movable with respect to one another along a direction parallel to the X-axis, Z-axis, or both.

As further illustrated in FIG. 1A, the processing apparatus 100 includes a deflection electrode 144 disposed proximate the aperture 116. The deflection electrode 144 and extraction plate 114 may form part of an extraction system used to control ion beam extraction as discussed below. In various embodiments, the deflection electrode 144 may be an electrically conductive component that is coupled to the deflection electrode power supply 134 whose operation is detailed below. In brief, the deflection electrode 144 may function to adjust the optics of extraction of ions through the aperture 116. As illustrated in FIG. 1A, for example, when the deflection electrode 144 is located proximate the aperture 116, ions 118 may be extracted through the aperture 116 as two different ion beamlets. In particular embodiments, the extraction plate power supply 136 may be configured to apply an extraction plate voltage to the extraction plate 114 independently of a bias voltage applied to the deflection electrode 144 applied by the deflection electrode power supply 134.

Figure 1B:
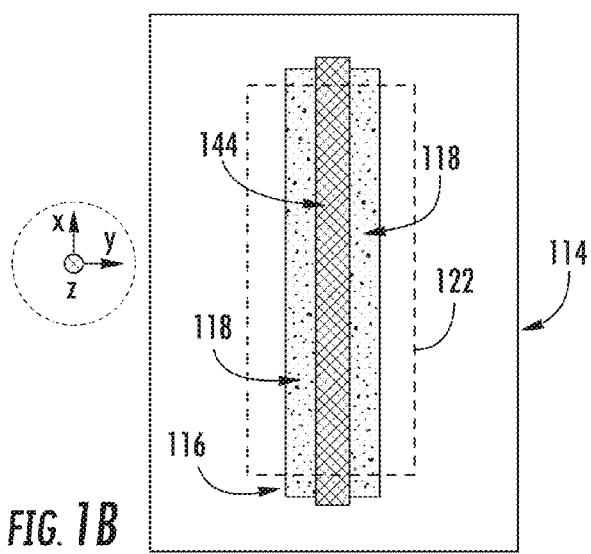
FIG. 1B depicts a top view of an extraction system of the processing system of FIG. 1A.

FIG. 1B provides a plan view depiction of one embodiment of the extraction plate 114 and deflection electrode 144. In this embodiment, the aperture 116 and deflection electrode 144 are elongated in the direction parallel to the X-axis, so as to extract ions 118 as ribbon beams. In various embodiments, ion beam width of the ions 118 along the X-axis may be greater than the dimension of the substrate 122 along the X-axis as illustrated. For example, for a substrate dimension along the X-axis of 30 cm, the width of an ion beam may be a few cm wider such as 33 cm, so that the substrate 122 is processed on its entire width in one pass. In the embodiments disclosed herein below, system parameters such as the RF power delivered to the antenna or voltage applied by components of processing apparatus 100 to different elements of the system, as well as positioning of the deflection electrode 144 and extraction plate 114 may be adjusted to tailor the extraction optics of ions and to provide ion beamlets to a substrate, such as the substrate 122.

Figure 2A:
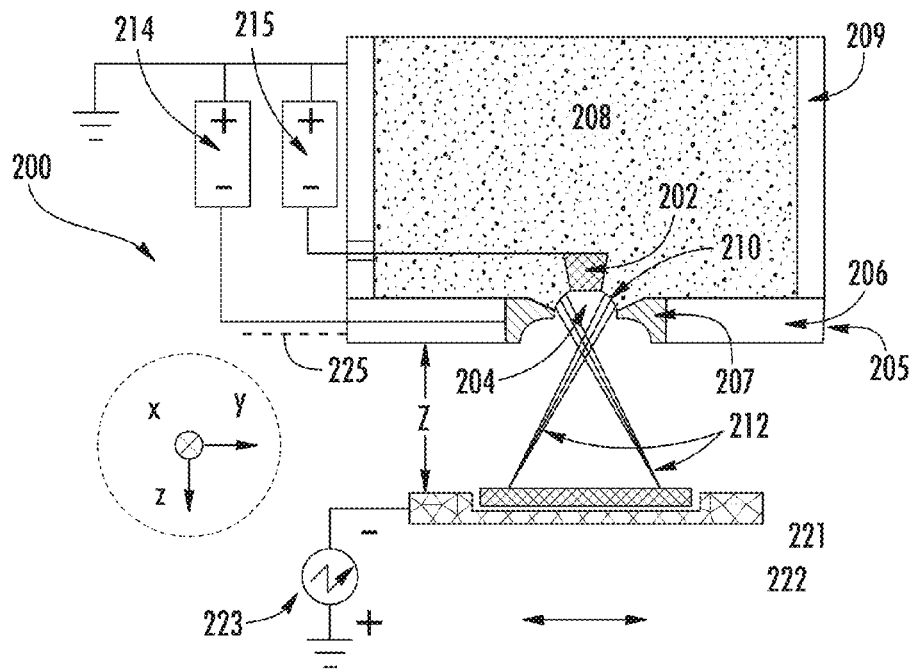
FIGS. 2A and 2B depict details of the extraction geometries of a processing system consistent with further embodiments.
Figure 2B:
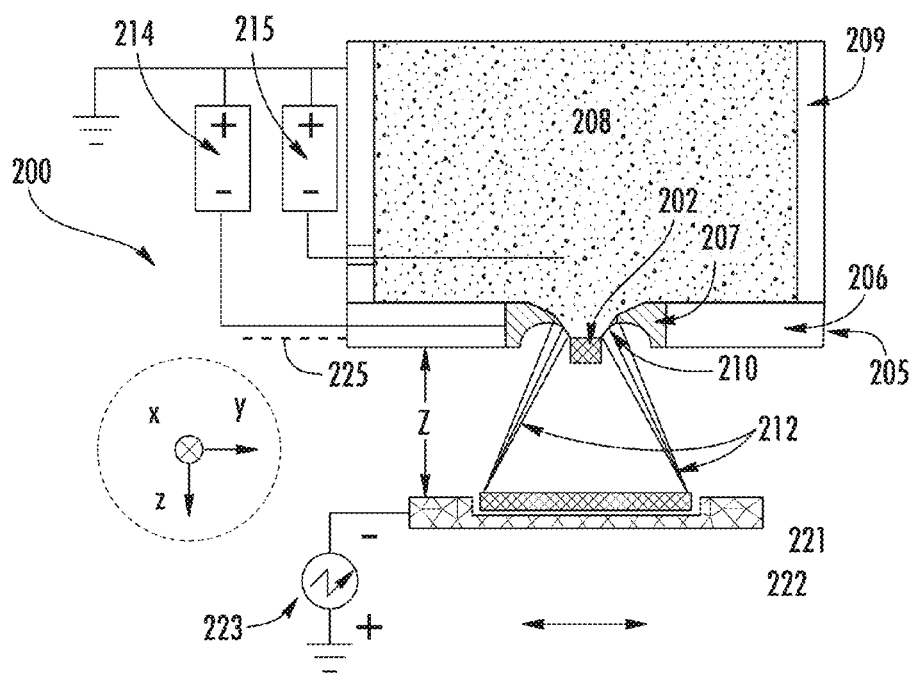

FIGS. 2A and 2B depict details of the extraction geometry of a processing apparatus 200 consistent with further embodiments. The processing apparatus 200 may include the same components as in processing apparatus 100 in some embodiments. In the embodiment depicted in FIG. 2A, a deflection electrode 202 is disposed proximate an aperture 204 defined by an extraction plate 205. To prevent the extraction plate 205 from draining large ion currents from a plasma 208, the extraction plate 205 is made of two parts: a large electrically non-conductive part 206 at the periphery of the extraction plate and a small electrically conductive part, inner portion 207, which is disposed adjacent the aperture 204 and surrounding the aperture 204. For the configuration shown in FIG. 2A deflection electrode 202 is located inside the plasma source. In the configuration shown in FIG. 2B, the deflection electrode 202 is located outside a plasma chamber 209 that contains the plasma 208. Because of the natural geometric angle of this configuration, ion angular distributions characterized by large mean angles can be obtained. When the plasma 208 is generated in the plasma chamber 209, two plasma menisci 210 form between the deflection electrode 202 and the edges of the inner portion 207 that define the aperture 204. The inner portion 207 may be biased by an extraction plate power supply 214 and the deflection electrode 202 by a separate, deflection electrode bias power supply 215. When a high voltage is applied between the substrate holder 221 which is electrically connected with the substrate 222 and plasma chamber 209 that houses plasma 208, two ion beamlets 212 are directed at oblique incidence to the substrate 222, that is, along trajectories that forms a non-zero angle with respect to the Z-axis as shown. The high voltage is provided by a high voltage power supply 223 and for the configurations shown in FIGS. 2A and 2B it has the negative polarity on the substrate holder so that positive ions are extracted from the plasma 208. This oblique incidence may be useful for treating surfaces of features that may be aligned so their surfaces are not parallel to the X-Y plane. These kind of features are common for 3D semiconductor structures. In various embodiments, parameters such as the position of the deflection electrode 202 as well as voltages applied to different components of an extraction voltage system (see extraction voltage system 130 of FIG. 1A) may be adjusted to adjust the angle(s) of incidence and the angular spread of ion beam(s) directed to a substrate such as substrate 222. In other embodiments, the high voltage difference between the plasma chamber 209 and substrate holder 221/substrate 222, is applied by the high voltage power supply 223 in which positive polarity is applied to the plasma chamber 209 and electrical ground on substrate holder 221. In such configurations the extraction plate power supply 214 and the deflection electrode bias power supply 215 are referenced with respect to the high voltage power supply 223, i.e., are floating at the plasma chamber potential.

Figure 3A:
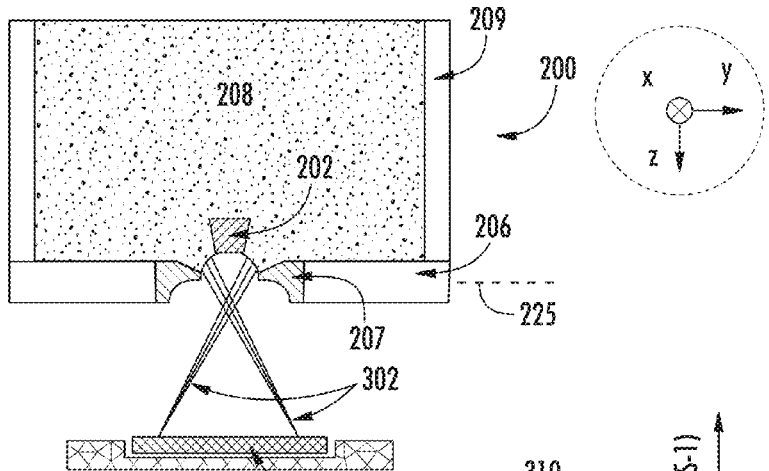
FIGS. 3A and 3B depict one operation scenario for system of FIG. 2A.
Figure 3B:
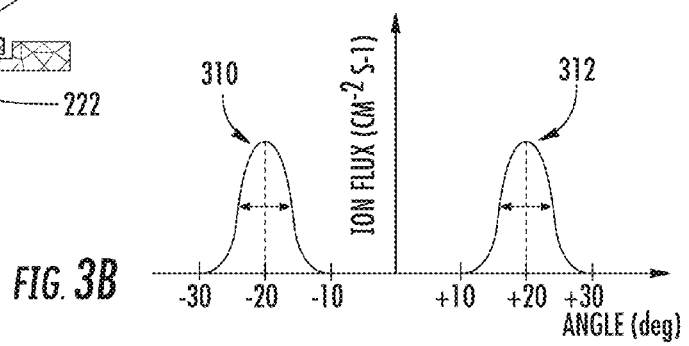

FIGS. 3A and 3B depict one operation scenario for processing apparatus 200 in which a pair of ion beams 302 are extracted from the plasma 208 under a first set of conditions. For simplicity it may be assumed that ions within each of the ion beams 302 form a same mean angle with respect to perpendicular to the substrate 222 and form the same angular range of angles of incidence, where a mean angle is defined by the absolute value of the angle with respect to perpendicular unless otherwise noted. Thus an angle (+) θ with respect to perpendicular (the Z-axis direction) and an angle −θ with respect to perpendicular may be deemed to constitute the same mean angle. FIG. 3B presents exemplary symmetrical ion angular distributions 310, 312 which may represent the angular distributions of the pair of ion beams 302. As illustrated, the mean angle of ion beams 302 is +/−20 degrees with respect to perpendicular (Z axis) to the substrate plane. The angular distribution depicted in FIG. 3B is merely for exemplification purposes and is shown as a Gaussian shape. For this type of distribution the angular spread may be defined simply as the full width at half maximum (FWHM), which in this case is approximately 10 degrees. As will be shown later, in practice the ion angular distribution may have a much more complex shape, and depending of the extraction optics geometry, might be skewed toward lower or higher angles. For all distributions different than Gaussian distribution, the angular spread may be defined as half of the difference between the maximum and minimum angles of a particular beamlet.

Figure 3C:
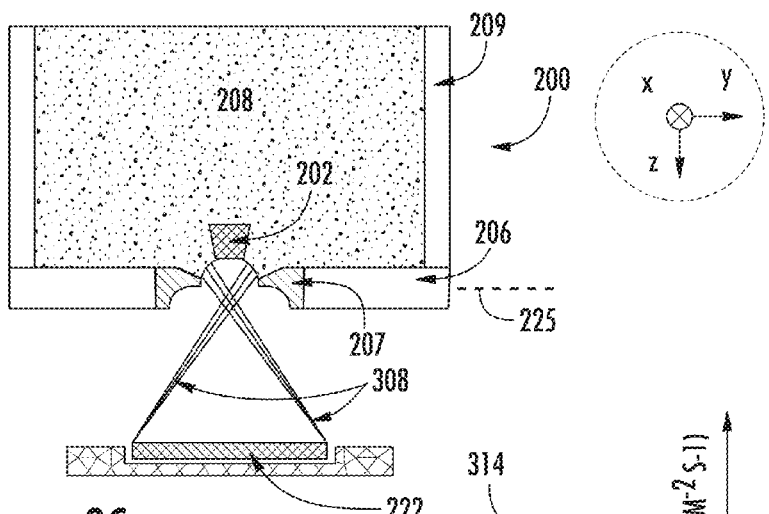
FIGS. 3C and 3D depict another operation scenario for the system of FIG. 2A.
Figure 3D:
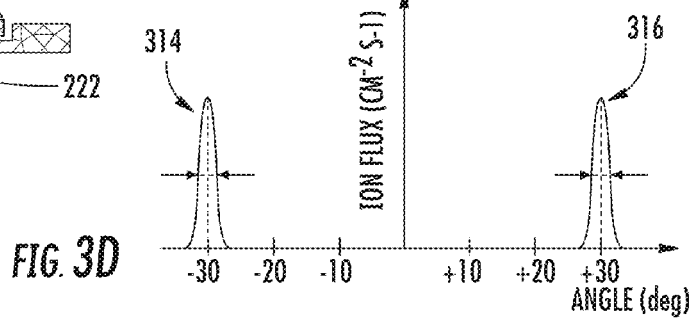

FIGS. 3C and 3D depict another operation scenario for processing apparatus 200 in which a pair of ion beams 308 are extracted from a plasma 208 under a second set of conditions. For simplicity it may be assumed that ions within each of the ion beams 308 form a same mean angle with respect to perpendicular to the substrate 222 and form the same angular range of angles of incidence. FIG. 3D presents exemplary symmetrical ion angular distributions 314, 316 which may represent the angular distributions of the pair of ion beams 308. As illustrated, the mean angle of ion beams 308 is +/−30 degrees with respect to perpendicular (Z axis) to the substrate plane. Similarly as for the distribution shown in FIG. 3B, the angular spread of the distribution is the full width at half maximum (FWHM), which in this case is approximately 2 degrees.

Consistent with various embodiments, the variation in beam IAD characteristics (mean angle and angular spread) exhibited between the ion beams 302 and ion beams 308 may be generated by variation of any combination of changes in various parameters. The variation in beam geometry may be achievable without breaking vacuum of a processing apparatus. For this reason, the present embodiments facilitate what is termed in-situ control of ion mean incidence angle, angular spread, in other words Ion Angular Distribution (IAD) of ions provided to a substrate. According to various embodiments, in situ variation of ion angular distribution may be generated by changes in position of the deflection electrode 202; variation in aperture size; changes in RF power delivered to the plasma 208; changes of the gas pressure; or changes in voltages applied to components of the processing apparatus 200, including voltage applied to the deflection electrode 202, substrate holder 221/substrate 222, extraction plate 205, or plasma chamber 209. The embodiments are not limited in this context.

Figure 4B:
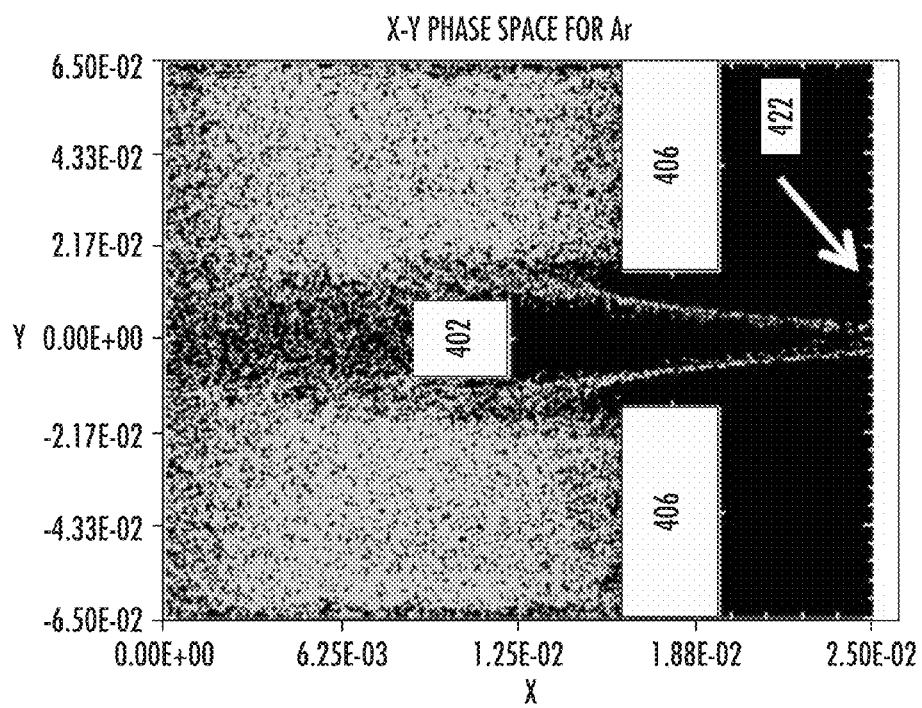
FIGS. 4A and 4B present results of simulation of ion trajectories in a processing system as a function of position of a deflection electrode with respect to an extraction plate.
Figure 4A:
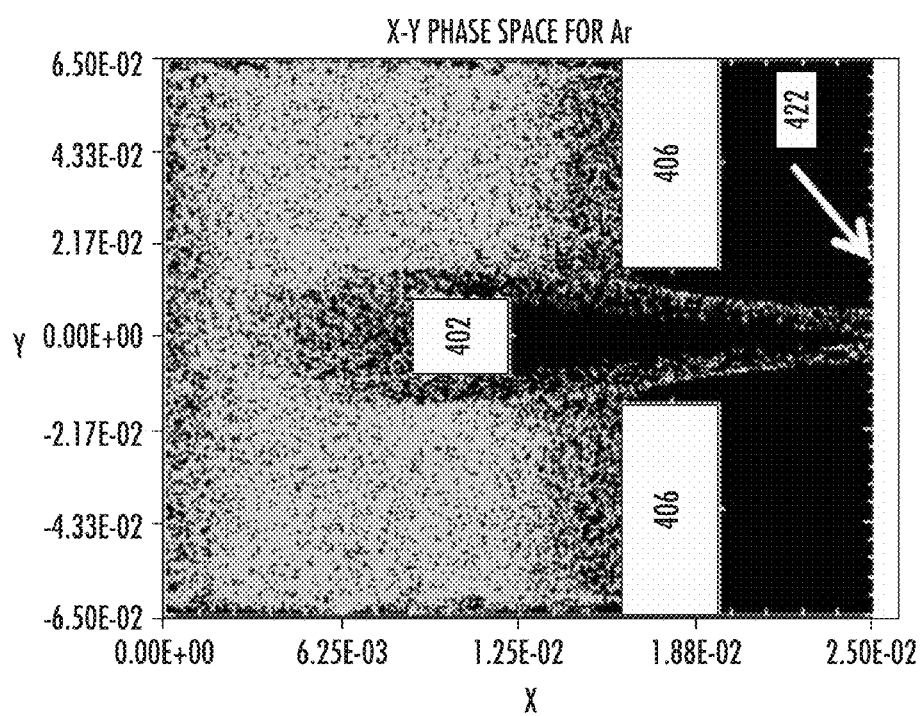

FIGS. 4A and 4B presents results of Object Oriented Particle In Cell (OOPIC) simulation of ion trajectories in a processing system as a function of position of a deflection electrode 402 with respect to extraction plate 406. In the example shown, the sample ions are Ar$^+$. The extraction voltage between plasma and substrate 422 is assumed to be 3 kV and a bias applied to the deflection electrode 402 of −100 V. No bias is applied on the extraction plate 406. In FIG. 4A the deflection electrode 402 is positioned 3.5 mm above the extraction plate 406, while in FIG. 4B the deflection electrode is positioned 4.5 mm above the extraction plate 406. As illustrated the ion trajectories become more pinched as the deflection electrode 402 is moved further from the extraction plate 406. Also, the beamlets spread in the Oy direction becomes narrower as the deflection electrode is moved farther from the extraction plate.

Figure 5A:
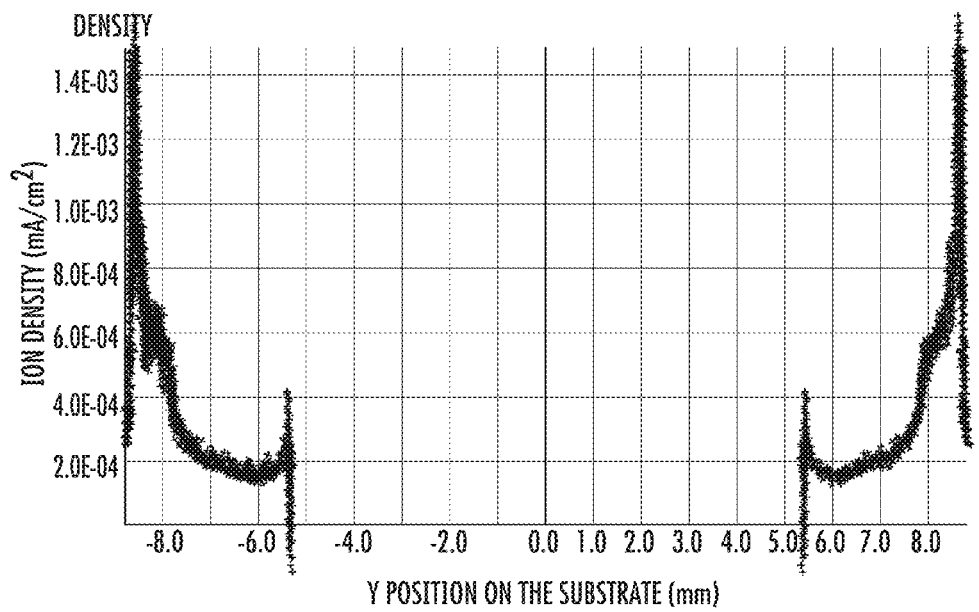
FIGS. 5A and 5B present modeling results of the ion beam density distribution on the wafer and ion beam emissivity for a 0 Volt bias voltage.
Figure 5B:
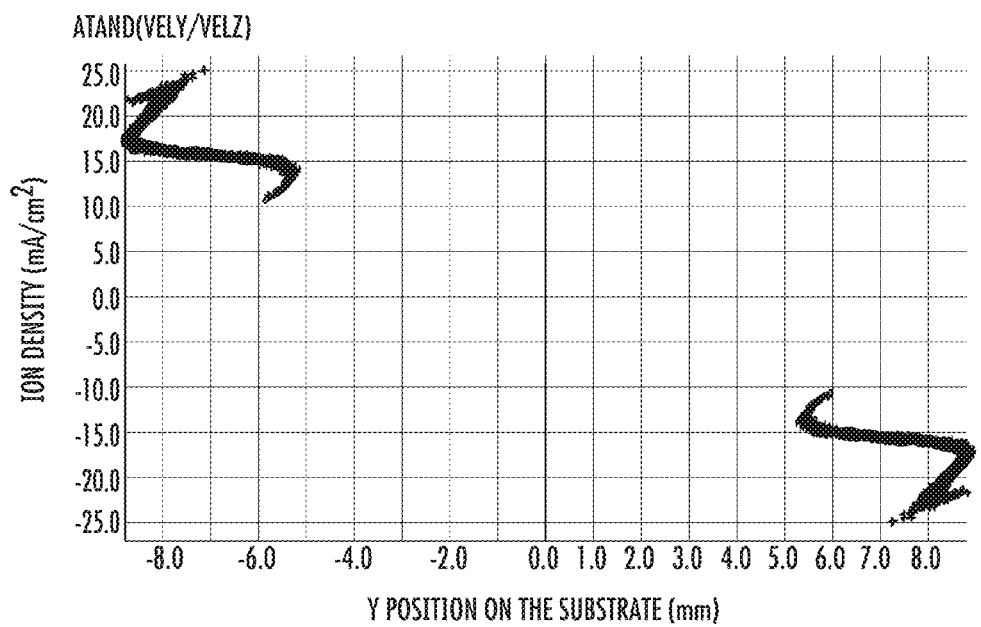
Figure 5C:
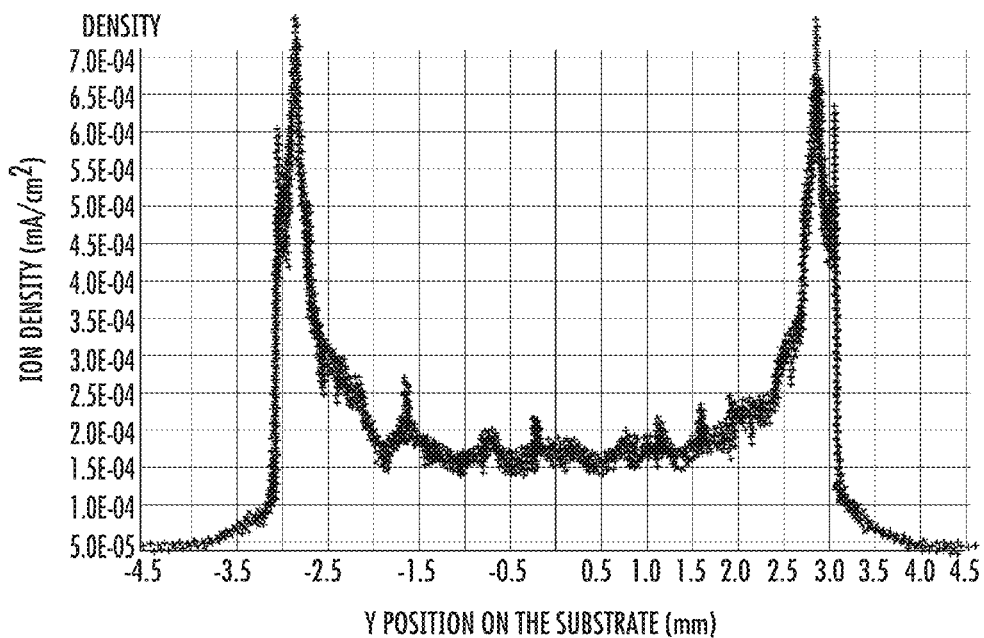
FIGS. 5C and 5D present ion beam distribution and ion beam emissivity for −300 V bias voltage.
Figure 5D:
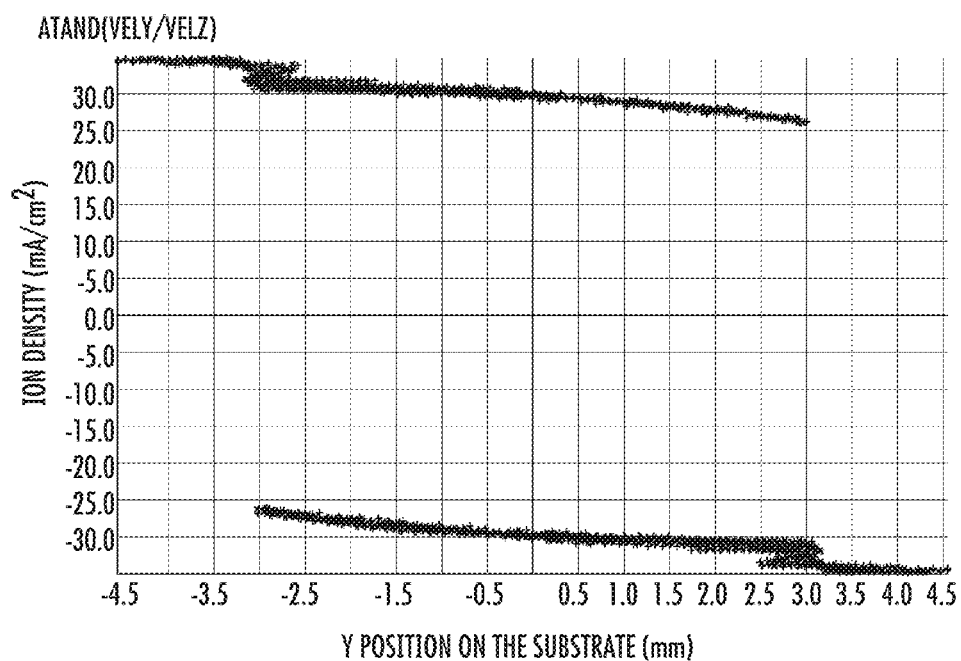

FIGS. 5A-5D present results of modeling of the extracted ion beamlets using OPERA software. FIG. 5A shows the ion density distribution on Oy direction at the location of the substrate surface for a 2 kV extraction voltage, 0 V bias voltage applied on the deflection electrode and unbiased extraction plate. There are two completely separated and symmetrical beamlets that span in the Oy direction from 5.2 mm to 9 mm and from −5.2 mm to −9 mm, respectively. The beamlets are strongly skewed toward higher y values with most of the beam hitting the substrate surface around ±8.8 mm. FIG. 5B depicts the beamlets emissivity, i.e., the angular beam characteristics vs beam position in the Oy direction. As can be seen most of the ions hit the substrate surface with an angle between 13 and 17 degrees, which results in a mean angle of ~15 degrees and an angular spread of ~4 degrees. The orientation of the emissivity curve shows the beamlets are convergent. FIG. 5C depicts ion density distribution on the substrate surface for identical conditions as for FIG. 5A but deflection electrode bias voltage of −300 V. In this case, two symmetrical beamlets also are obtained but they partially overlap. The beamlets are also skewed toward the extremities of the substrate but in this case the most of the ions hit the substrate between 2.5 and 3 mm and −2.5 and −3 mm, respectively. Beam emissivity depicted in FIG. 5D shows that in this case the ions hit the substrate at an angle between 25 and 30 degrees. The beamlets are also slightly convergent but most of the ions hit the surface at 30 degrees.

In further embodiments, the bias voltage applied to a deflection electrode or extraction plate may be adjusted to control ion beam trajectories i.e., ion angular distribution, for ions extracted through an aperture of a processing apparatus. In particular, a first bias voltage generated by a deflection electrode power supply may be configured to generate a first angle of incidence for ions extracted from plasma, while a second, different bias voltage generated by the deflection electrode power supply is configured to generate a second angle of incidence of ions extracted through the aperture that is different from the first angle of incidence. In some embodiments, a deflection electrode may be a single electrode in which a single bias voltage is applied, while in other embodiments, the deflection electrode may constitute multiple electrodes that are electrically isolated from one another and capable of receiving differing bias voltages.

Figure 6A:
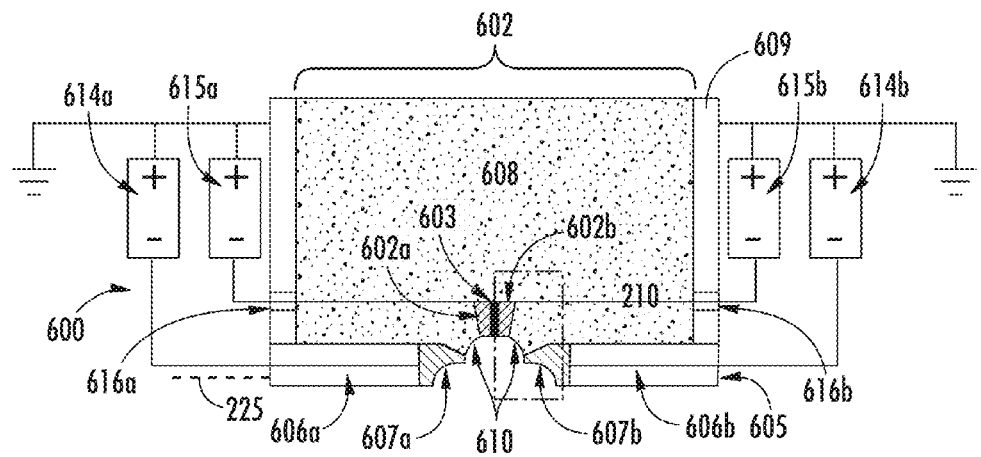
FIGS. 6A, 6B and 6C depict qualitative illustrations of the effect of varying voltage V applied to a deflection electrode when the deflection electrode is placed inside the plasma source.

FIG. 6A depicts details of an extraction system that forms part of a processing apparatus 600 according to various embodiments. As illustrated the extraction system (not separately shown) includes an extraction plate 605 and a deflection electrode 602 that is separated in two deflection electrode parts, deflection electrode part 602a and deflection electrode part 602b by an electrical insulator 603. Each part of the deflection electrode 602 can be biased independently by deflection electrode power supplies 615a and 615b. Connecting wires between the deflection electrode power supplies 615a, 615b and deflection electrode 602 may be passed inside a plasma chamber 609 through electrical feedthroughs 616a and 616b. They may also insulated from a plasma 608 with ceramic sleeves (not shown). The extraction plate 605, which is located in the proximity of deflection electrode 602, is composed of two dielectric parts, outer portions 606a and 606b and two electrically conductive parts, inner portions 607a and 607b. Each inner portion 607a, 607b may be biased independently by respective extraction plate power supplies 614a and 614b. When the plasma 608 is ignited a pair of plasma menisci 610 form between the deflection electrode part 602a and inner portion 607a on the one hand, and between deflection electrode part 602b and inner portion 607b on the other hand.

Figure 6B:
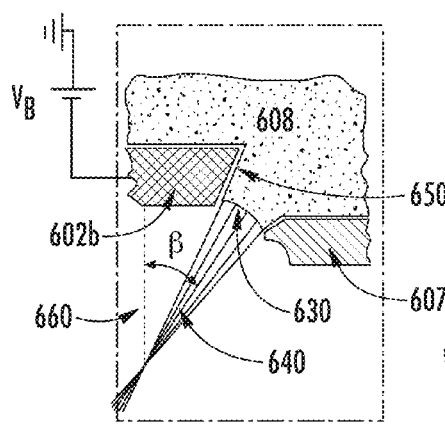
Figure 6C:
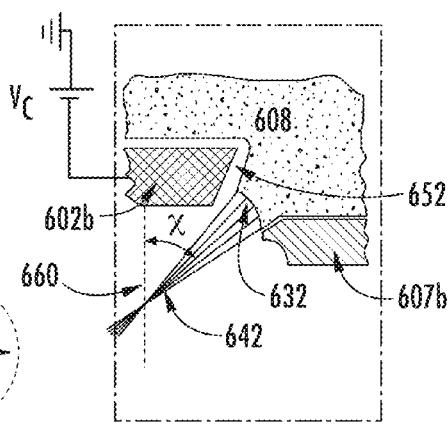
Figure 6D:
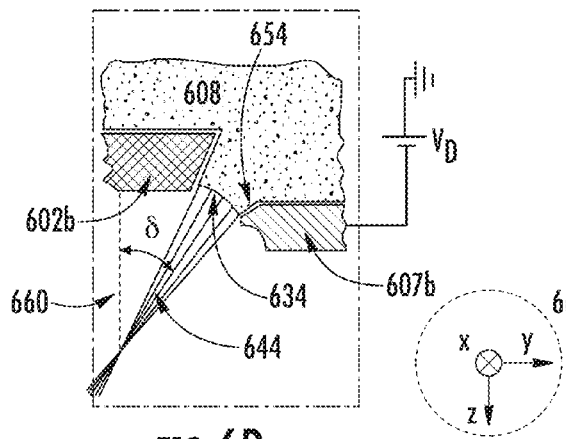
FIGS. 6D and 6E depict qualitative illustrations of the effect of varying voltage V applied to an extraction-plate when no voltage or a constant voltage is applied on a deflection electrode.
Figure 6E:
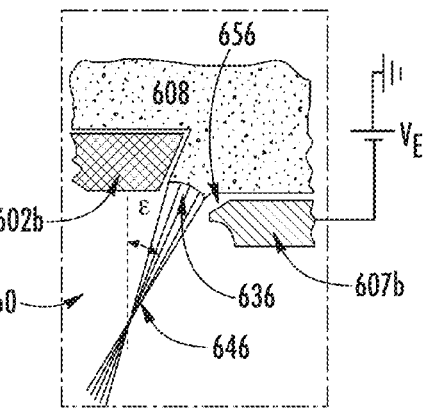

In brief, FIGS. 6B and 6C illustrate changes in the shape of a plasma meniscus is changed when deflection electrode bias voltage is varied while other parameters are held constant for a single deflection electrode-extraction plate inner portion pair. As illustrated, a meniscus 610 formed between inner portion 607b and deflection electrode part 602b may change substantially when bias voltage is varied. The change in shape may involve change in radius of curvature or may involve change in inclination of the meniscus with respect to a vertical plane crossing the deflection electrode 602. This, in turn, leads to a change in the angle of ion trajectories for ions extracted from the plasma 608. Similarly, FIGS. 6D and 6E illustrate changes in the shape of the plasma meniscus when extraction plate bias voltage is varied while other parameters are held constant. The change in shape may involve change in radius of curvature or may involve change in inclination of the meniscus with respect to a horizontal plane containing the tip of the extraction plate. This, in turn, leads to a change in the angle of ion trajectories for ions extracted from the plasma 608.

In particular embodiments, the voltage applied to a deflection electrode such as deflection electrode 602 may be varied from 0 V to −500 V. Because of negative potential, a plasma sheath develops in front of the deflection electrode surface. The plasma sheath thickness s is given by:

$$S = \frac{\sqrt{2}}{3} \lambda_D \left(\frac{2V}{T_e}\right)^{3/4} \quad (1)$$

where V is the absolute value of the negative biasing potential, $T_e$ electron temperature and $\lambda_D$ is the Debye length given by $$\lambda_D = \left(\frac{\varepsilon_0 k_B T_e}{e^2 n_e}\right)^{\frac{1}{2}} \quad (2)$$

where $\varepsilon_0$ is the permittivity of free space, $k_B$ is Boltzmann constant, e is elementary charge, and $n_e$ is electron density.

Returning to FIGS. 6B-6E, for clarity of the figures merely the rectangular area delimited by dotted lines in FIG. 6A is shown. In FIG. 6B, the voltage $V_B$ applied to the deflection electrode part 602b has a first value that is less than the voltage $V_C$ applied to the deflection electrode in FIG. 6C. In FIG. 6B the plasma sheath 650 is relatively thin and the resulting plasma meniscus 630 relatively more horizontally (with reference to the horizontal X-Y plane) inclined as compared to its counterpart, plasma meniscus 632 formed in FIG. 6C. This yields a mean angle β with respect to a perpendicular 660 to the plane Oxy, which is shown for ions of the ion beam 640 extracted from the plasma 608. Turning to FIG. 6C, the plasma sheath 652 is relatively thicker because the voltage $V_C$ is more negative. The plasma 608 is accordingly pushed further inside the plasma chamber adjacent the deflection electrode part 602b. As a result the location and the shape of the plasma meniscus 632 is modified, resulting in a more vertically oriented plasma meniscus 632. This, in turn leads to larger ion mean angle χ for ions of ion beam 642 as compared to mean angle β of FIG. 6B.

In FIG. 6D the voltage $V_D$ applied to the inner portion 607b has a first value that is less than the voltage $V_E$ applied to the extraction plate in FIG. 6E. In FIG. 6D the plasma sheath 654 is relatively thin and the resulting plasma meniscus 634 relatively more vertically (with reference to the horizontal X-Y plane) inclined as compared to its counterpart, plasma meniscus 636 formed in FIG. 6E. This yields a mean angle δ with respect to a perpendicular 660 to the plane Oxy, which is shown for ions of the ion beam 644 extracted from the plasma 608. Turning to FIG. 6E, the plasma sheath 656 is relatively thicker because the voltage $V_E$ is more negative. The plasma 608 is accordingly pushed further inside the plasma chamber 609 (see FIG. 6A) adjacent the inner portion 607b. As a result the location and the shape of the plasma meniscus 636 is modified, resulting in a more horizontally oriented plasma meniscus 636. This, in turn leads to a smaller ion mean angle ∈ for ions of ion beam 646 as compared to mean angle δ of FIG. 6D.

It is to be noted that in some implementations the deflection electrode 602 may be composed of two symmetrical deflection electrode parts, deflection electrode part 602a and deflection electrode part 602b; similarly, the extraction plate 605 may have two symmetrical inner portions, inner portion 607a inner portion 607b as shown in FIG. 6A. This may result in formation of symmetric menisci that form on opposite sides of the deflection electrode 602 as suggested in FIG. 6A. Thus, in addition to ion beams 640, 642, 644, and 646, second ion beams (not shown) having a mean angle of −β, −χ, −δ, and −∈ with respect to perpendicular 660 may be generated in the scenario of FIGS. 6B, 6C, 6D, and 6E. In other embodiments, bias voltages driven by the bias power supplies 614a and 614b and 615a and 615b may be controlled independently. In this manner, a first meniscus formed between deflection electrode part 602a and inner portion 607a may be different in shape and orientation from a second meniscus determined by the deflection electrode part 602b and inner portion 607b. In this case, different ion angular distributions may be obtained for each beamlet generated from the first and second meniscus. In the case in which bias voltages on deflection electrode parts 602a and 602b are identical and bias voltages of the inner portion 607a and inner portion 607b of extraction plate 605 are identical, but not necessarily equal to the deflection electrode bias voltage, the processing apparatus 600 is configured to deliver two symmetrical beamlets characterized by mean angles θ and −θ and same angular spread Δθ. To obtain different ion angular distributions, bias voltages can be configured in different ways: either merely deflection electrode parts 602a and 602b are biased (different or equal voltages), either merely inner portion 607a and inner portion 607b of the extraction plate 605 are biased (different or equal voltages), both deflection electrode part 602a and deflection electrode part 602b and inner portion 607a and inner portion 607b are biased, or any combination of extraction plate and deflection electrode bias is applied.

It is to be noted that in the present embodiments, the cross-sectional shape of a deflection electrode (in the Y-Z plane) may be any convenient shape appropriate for providing control of plasma menisci, such as a rectangular, triangular, circular, elliptical, and so forth. In addition, deflection electrode may be located inside the plasma source or outside the plasma source.

Figure 7A:
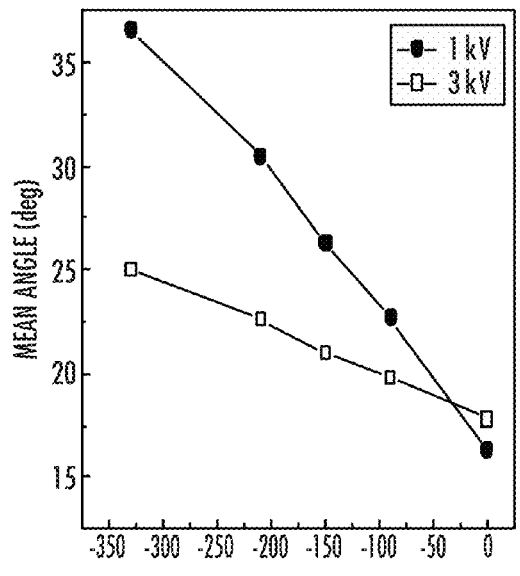
FIGS. 7A-7C present experimental results on modification of ion angular distribution when a deflection electrode is biased.
Figure 7B:
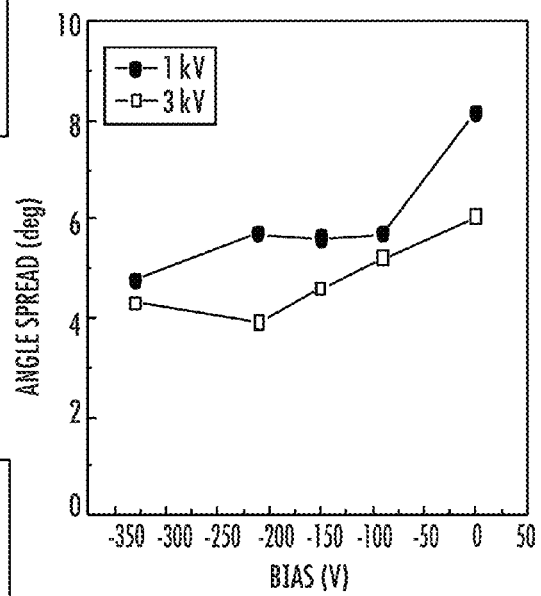
Figure 7C:
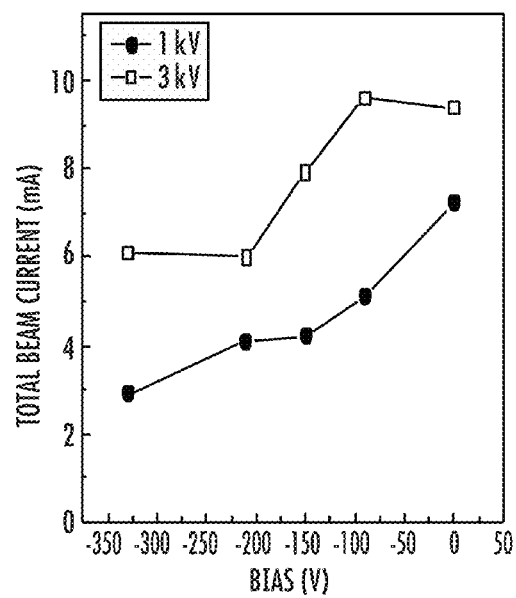

FIG. 7A-7C depicts experimental results of measurements of mean angle, angle spread and ion beam current as a function of bias voltage applied to a deflection electrode arranged in conjunction with an extraction plate aperture as described above with respect to FIG. 6A. Two particular conditions are shown: 1 keV and 3 keV ion energy. The bias voltage applied to the deflection electrode ranges between 0 and −330 V. No bias voltage is applied to the extraction plate. As is evident form FIG. 7A, a linear increase in mean angle takes place as a function of increasingly negative bias voltage applied to the deflection electrode. Over this bias voltage range the mean beam angle changes from 15 degrees to 36 degrees for 1 keV beam ion beam energy, and from 18 degrees to 25 degrees for 3 keV ion beam energy, where the larger angle represents a greater deviation from perpendicular incidence (along the Z-axis). This change represents a change in the mean angle of 0.06 degrees per volt of bias voltage for 1 keV beam energy and 0.02 degrees per volt of applied bias voltage for the 3 keV beam energy, respectively. This difference in the slope of mean angle vs bias voltage appears due to different electrostatic configurations of the extraction optics: at 3 keV extraction voltage (i.e., beam energy) electric field lines protrude deeper into the plasma than at 1 keV extraction voltage; consequently it is harder for the bias voltage to shape the plasma meniscus at higher extraction voltage than at lower extraction voltage Thus, processing apparatus arranged according to the embodiments of FIGS. 6A-6E present a convenient manner to tune ion beam incidence angle for ions directed to a substrate by varying bias applied to a deflection electrode over an easily accessible voltage range.

In addition to causing a change in the orientation of the plasma meniscus and thereby a change in beam angle as suggested by FIGS. 6A-6E, changes in voltage applied to a deflection electrode may change the curvature of the plasma meniscus. Such change may result in a different ion angle spread for ions extracted from the plasma. As shown in FIG. 7B, ion angular distribution becomes tighter as the bias voltage is increased in absolute value: from 8 degrees at 0 bias voltage down to 4-5 degrees at −330 volts.

Changes of the ion angular distribution characteristics by changing the deflection electrode bias voltage are accompanied by changes in the extracted ion beam current. As shown in FIG. 7C, as the bias voltage is increased in absolute value, the extracted ion beam current decreases monotonically, from 9 mA down to 6 mA in the case of 3 keV ion beam energy and from 6 mA down to 3 mA for the 1 keV ion beam energy, respectively. This effect is a result of two physical phenomena: a decrease in the meniscus area and a decrease of ion density in the vicinity of the deflection electrode.

In various additional embodiments, voltage applied to a deflection electrode or extraction plate may be adjusted in conjunction with in situ adjustments to extraction geometry, where the extraction geometry includes the relative position of deflection electrode and aperture, relative size of aperture, and relative position of different deflection electrode components, and aperture plate components, among other factors.

In particular embodiments, the deflection electrode and extraction plate are interoperative to adjust the angle of incidence of an extracted ion beam by movement of at least one extraction component with respect to another, such as movement of the deflection electrode or aperture plate. In some instances, the movement of the deflection electrode may involve movement of the first portion of the deflection electrode with respect to a second portion of the deflection electrode. Similarly, in other instances, the movement of the aperture plate may involve movement of a first portion of an aperture plate with respect to a second portion of the aperture plate. Any combination of such movements may alter the shape or size or both of a meniscus used to extract the ion beamlets and thereby alter the angle of incidence and the angular spread.

FIGS. 8A-8D present illustration of operation of different extraction components in processing apparatus according to different embodiments. The extraction components include a deflection electrode and aperture plate in these illustrations. In FIG. 8A, a portion of a processing apparatus 800 is illustrated showing an extraction plate 805 composed of electrically non-conductive parts 806a and 806b and electrically conductive parts, inner portions 807a and 807b. The extraction plate 805 is positioned adjacent a plasma 808. A deflection electrode 802 is located adjacent the aperture (not separately shown) defined by the inner portions 807a and 807b. In this embodiment, the deflection electrode 802 is movable along an axis 809 parallel to the Z-axis for the Cartesian coordinate system shown. This axis 809 lies perpendicular to the X-Y plane which defines a plane of the extraction plate 805. Thus, the deflection electrode 802 may move away from or toward the extraction plate 805. In some instances, the deflection electrode 802 may be configured to move even below the extraction plate 805. The deflection electrode 802 and inner portions 807a and 807b of extraction plate 805 may be coupled to voltage sources (not shown) to vary voltage to either deflection electrode 802 or extraction plate 805, as described above with respect to FIGS. 6A-6D.

As noted above with respect to FIGS. 4A and 4B, the motion of a deflection electrode may generate changes in ion trajectories for ions extracted from a plasma, such as plasma 808. In the processing apparatus 800 of FIG. 8A, the deflection electrode 802 may be moved with respect to the extraction plate 805 while voltages applied to deflection electrode 802 and inner portions 807a, 807b remain constant. This motion in itself may vary the shape of the plasma menisci 810 and 811. However, in other embodiments, voltage applied to the deflection electrode 802 or inner portions 807a and 807b may be varied in conjunction with movement of the deflection electrode 802 along the axis 809. Such coupled changes in voltage applied to extraction components with movement of the deflection electrode 802 provides further control over mean ion angle and ion angular distribution for ions extracted from the plasma 808.

According to other embodiments, the deflection electrode may be composed of two parts, deflection electrode parts 822a and 822b as shown in FIG. 8B. In FIG. 8B, a portion of a processing apparatus 820 is illustrated showing an extraction plate 825 composed of electrically non-conductive parts 826a and 826b and electrically conductive parts, inner portions 827a and 827b. These parts can move independently along the axis 829, which is parallel with the Oz axis of the Cartesian coordinate system. By changing the relative positions of the deflection electrode parts 822a and 822b with respect to the inner portions 827a and 827b of an extraction plate 825, the shape of plasma menisci 830 and 831 may be changed, resulting in different ion mean angle and angular distributions of the extracted ion beamlets. In addition, the bias voltages applied to the deflection electrode parts 822a and 822b or applied to inner portions 807a and 807b may be varied in conjunction with movement of the deflection electrode parts 822a and 822b along the axis 809. Such coupled changes in bias voltages applied to extraction components with movement of the deflection electrode parts 822a and 822b provides further control over mean ion angle and ion angular distribution for ions extracted from the plasma 808.

FIG. 8C provides an example of a processing apparatus 840 that includes an extraction plate 845 composed of electrically non-conductive parts, outer portions 846a and 846b and electrically conductive parts, inner portions 847a and 847b. The extraction plate has independently movable portions, shown as portion 852, composed of outer portion 846a and inner portion 847a, and portion 854, composed of outer portion 846b and inner portion 847b. The portion 852 and portion 854 are each movable along an axis 849 that lies parallel to the Y-axis. When moving in opposite directions along the axis 849 the portions 852 and 854 may increase or decrease the width of the extraction plate aperture. This change in width serves to change the shape and position of plasma menisci 850 and 851 that form between the deflection electrode 842 and inner portions 847a and 847b, respectively, of the extraction plate 845.

FIG. 8D presents a further embodiment of a processing apparatus 860 in which an extraction plate 866 includes independently movable portions, shown as portion 863 and 865. The portion 863 and portion 865 are each movable along an axis 869 that lies parallel to the Z-axis. As illustrated in FIG. 8D this motion allows the extraction plate 866 to assume a staggered configuration in which movement of the portions 863 and 865 with respect to one another causes them to be positioned in different planes P1, P2 where each plane may be parallel to the X-Y plane. In the example illustrated, this results in two different plasma menisci, shown as plasma menisci 870, 871, which differ from one another in shape. The difference in shape is effective to generate different mean angles in ion beams (not shown) that are extracted from plasma 808 via the plasma menisci 870, 871 when an extraction voltage is applied. It is also notable that the plasma meniscus adjacent the lower portion, such as plasma meniscus 871, may be oriented more vertically and produce a mean angle that has a higher deviation from perpendicular to the plane P2. In various embodiments, a single processing system may incorporate the movement capability of the various extraction components exhibited in FIGS. 8A-8D. Thus, an extraction system may provide motion of separate parts of deflection electrode with respect to an extraction plate as well as relative motion of separate portions of an extraction plate with respect to one another in two orthogonal directions.

Figure 9:
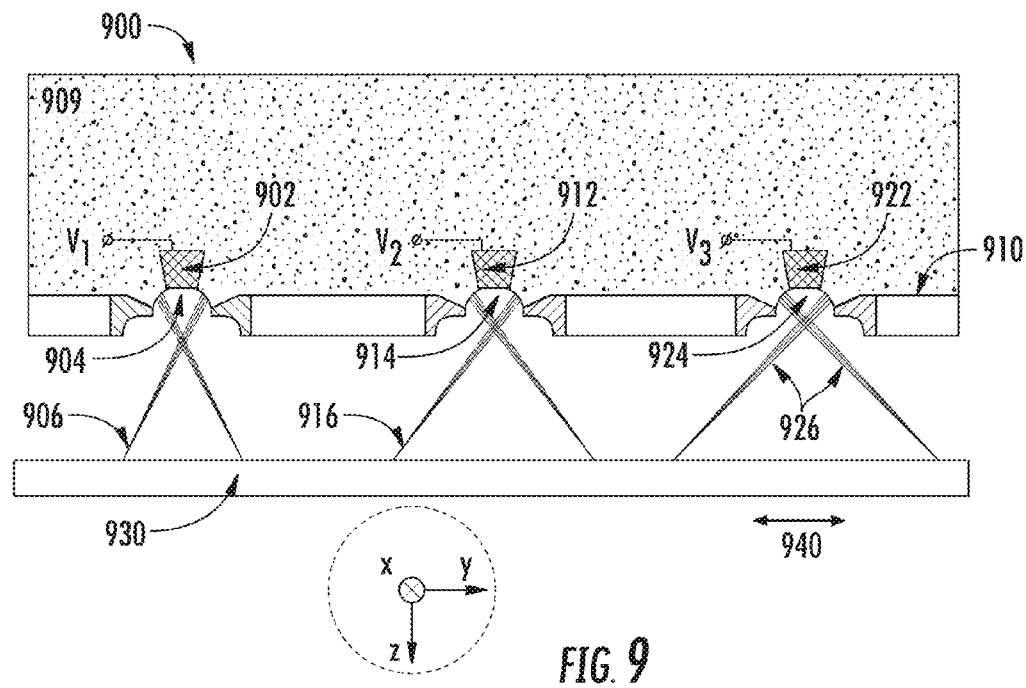
FIG. 9 depicts a portion of a processing system that includes an extraction plate provided with multiple apertures according to one embodiment.

In various additional embodiments, an extraction plate may include multiple apertures in which at least one aperture includes a deflection electrode. FIG. 9 depicts a portion of a processing apparatus 900 that includes an extraction plate 910 provided with three apertures, apertures 904, 914, and 924. Deflection electrodes 902, 912, and 922 are located proximate apertures 904, 914, and 924, respectively. In various embodiments, deflection electrodes 902, 912, and 922 may each be provided with a separate voltage source that allows independent control of voltage, shown as voltages $V_1$, $V_2$, and $V_3$ for simplicity. When an extraction voltage is applied between the plasma and the substrate 930, this may allow the extraction plate 910 to extract simultaneously from plasma 908 three different sets of ion beams 906, 916, and 926, where mean angle is varied between the different sets of ion beams as illustrated. This may be useful for providing ions having different incidence angles to a substrate 930 when the substrate is scanned along the axis 940 in a single pass under all of the apertures, 904, 914, 924. It is to be noted that in various additional embodiments, in multiple aperture extraction plates, the position of deflection electrodes with respect to respective apertures may be adjustable, as well as the width of apertures, and the relative position of different extraction plate portions along the Z-axis direction, as highlighted in FIGS. 8A-8D.

Figure 10:
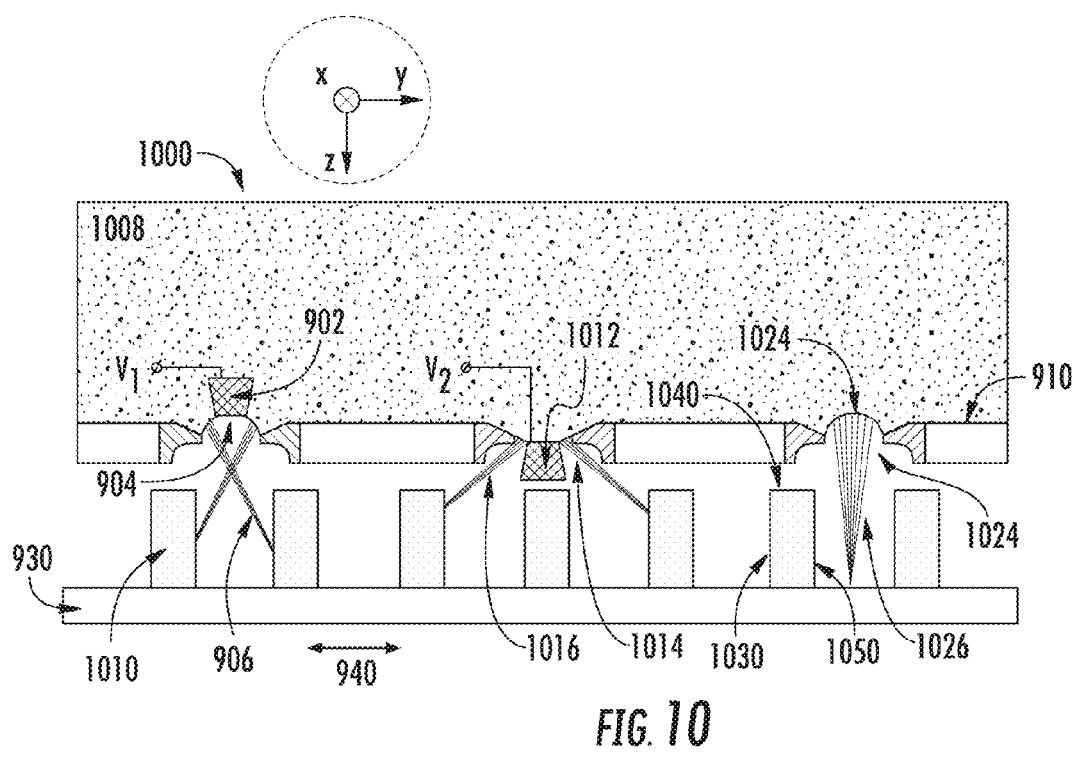
FIG. 10 depicts a portion of a processing system according to another embodiment that includes another extraction plate provided with multiple apertures.

FIG. 10 depicts a portion of a processing apparatus 1000 according to another embodiment that includes an extraction plate 910 provided with three apertures, apertures 904, 1014, and 1024. Deflection electrodes 902, and 1012, are located proximate apertures 904, 1014, respectively, as in the embodiment of FIG. 9, except the fact that deflection electrode 1012 is located outside the plasma chamber (not shown). By placing the deflection electrode 1012 in the proximity of the aperture 1014 but outside the plasma chamber allows extraction of ion beams 1016 with very large mean angles as described in FIG. 2B. Furthermore, in this embodiment, no deflection electrode is located proximate the aperture 1024. In this case, a single ion beam ion beam 1026 is extracted from the aperture 1024. Depending upon the width of the aperture 1024 along the Y-direction, the shape of the meniscus 1025 may vary. In the example shown in FIG. 10, resultant ion trajectories of an ion beam 1026 that is extracted from plasma 1008 through aperture 1024 are aligned closely with the Z-axis so that the ion beam 1026 strikes the substrate 930 at nearly perpendicular incidence. The combination of ion trajectories provided by the extraction plate 910 may be particularly useful for treating certain features of a substrate, such as relief features 1010. As shown in FIG. 10, the processing apparatus 1000 generates ion beams 906, 1016, 1026 that strike both sidewalls 1030, 1050 and horizontal surfaces 1040 of each relief feature 1010 when the substrate 930 is scanned along the axis 940 in a back-and-forth pass.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A processing apparatus comprising:
a plasma source coupled to a plasma chamber to generate a plasma in the plasma chamber;
an extraction plate disposed along a side of the plasma chamber, the extraction plate having an aperture;
a deflection electrode comprising an electrically conductive material, the deflection electrode disposed within the plasma chamber above the aperture and in contact with the plasma, the deflection electrode forming a pair of openings between the deflection electrode and edges of the extraction plate defining the aperture; and
a deflection electrode power supply connected to the deflection electrode to generate a variable bias voltage with respect to the plasma chamber, wherein a first bias voltage applied to the deflection electrode is configured to generate a first angle of incidence for ions extracted from the plasma through at least one opening of the pair of openings, and a second bias voltage applied to the deflection electrode is configured to generate a second angle of incidence for ions extracted from the plasma through the at least one opening, the second angle of incidence being different from the first angle of incidence.

2. The processing apparatus of claim 1, wherein the deflection electrode is configured to move in a direction perpendicular to a plane defined by a plane of the extraction plate, wherein in a first deflection electrode position a first distance from the plane, ions extracted from the plasma have a first angular incidence, and wherein in a second deflection electrode position a second distance from the plane, the second distance being greater than the first distance, ions extracted from the plasma have a second angular incidence different from the first angular incidence.

3. The processing apparatus of claim 1, further comprising an extraction plate power supply configured to apply an extraction plate voltage to the extraction plate independently of the variable bias voltage being applied to the deflection electrode.

4. The processing apparatus of claim 1, wherein the extraction plate includes a first portion and second portion and defines a plane, the processing apparatus further comprising a first extraction plate power supply configured to supply a first bias voltage to the first portion, and a second extraction plate power supply configured to supply a second bias voltage to the second portion.

5. The processing apparatus of claim 4, wherein the aperture comprises a first aperture and the deflection electrode comprises a first deflection electrode, and wherein the extraction plate comprises a third portion disposed adjacent the second portion and configured to define a second aperture therebetween.

6. The processing apparatus of claim 5, wherein the pair of openings comprises a first pair, the process apparatus further comprising a second deflection electrode disposed adjacent to the second aperture and configured to generate a second pair of openings between the second deflection electrode and edges of the extraction plate defining the second aperture.

7. The processing apparatus of claim 1, wherein the pair of openings define a pair of plasma menisci, wherein a meniscus shape of the pair of plasma menisci varies when power from the plasma source is varied over a plasma power range, wherein an average angle of incidence of ions extracted through the pair of plasma menisci varies by at least ten degrees.

8. A processing apparatus comprising:
a plasma source coupled to a plasma chamber to generate a plasma in the plasma chamber;
an extraction plate disposed along a side of the plasma chamber, the extraction plate comprising:
an outer portion, the outer portion being electrically insulating; and
an inner portion, the inner portion being electrically conductive and defining an aperture;
a deflection electrode comprising an electrically conductive material, the deflection electrode being in contact with the plasma and disposed adjacent the aperture and forming a pair of openings between the deflection electrode and edges of the extraction plate defining the aperture;
a deflection electrode power supply connected to the deflection electrode to generate a bias voltage with respect to the plasma chamber; and an extraction plate power supply configured to apply an extraction plate voltage to the extraction plate independently of the bias voltage applied to the deflection electrode.

9. The processing apparatus of claim 8, wherein the deflection electrode is disposed within the plasma chamber.

10. The processing apparatus of claim 8, wherein the deflection electrode comprises a first deflection electrode part and second deflection electrode part that are electrically conductive and electrically isolated from one another, wherein the deflection electrode power supply is a first deflection electrode power supply, the first deflection electrode part is coupled to the first deflection electrode power supply, the processing apparatus further comprising a second deflection electrode power supply coupled to the second deflection electrode part, wherein the first deflection electrode part and second deflection electrode part are coupled to receive bias voltages independently from one another from the respective first and second deflection electrode bias supplies.

11. The processing apparatus of claim 8, wherein the aperture comprises a first aperture and the deflection electrode comprises a first deflection electrode, wherein the extraction plate comprises a second inner portion disposed adjacent the outer portion, the second inner portion being electrically conductive and configured to define a second aperture therebetween, and wherein the pair of openings comprises a first pair, the processing apparatus further comprising:
   a second deflection electrode disposed adjacent to the second aperture and configured to generate a second pair of openings between the second deflection electrode and edges of the extraction plate defining the second aperture.

12. A processing apparatus comprising:
   a plasma source coupled to a plasma chamber to generate a plasma in the plasma chamber;
   an extraction plate disposed along a side of the plasma chamber and lying parallel to a plane, the extraction plate comprising a first portion and a second portion defining an aperture, wherein the first portion and second portion are independently movable along an axis perpendicular to the plane;
   a deflection electrode comprising an electrically conductive material, the deflection electrode being in contact with the plasma and disposed adjacent the aperture and forming a pair of openings between the deflection electrode and edges of the extraction plate defining the aperture,
   wherein movement of the first portion and second portion with respect to one another generates a first ion beam having a first angle of incidence and a second ion beam having a second angle of incidence.

13. The processing apparatus of claim 12 further comprising a deflection electrode power supply connected to the deflection electrode to generate a variable bias voltage with respect to the plasma chamber.

14. The processing apparatus of claim 12, wherein the extraction plate comprises:
   an outer portion, the outer portion being electrically insulating; and
   an inner portion, the inner portion being electrically conductive and defining the aperture.

* * * * *